United States Patent [19]

Holdaway

[11] 4,198,604
[45] Apr. 15, 1980

[54] HETERODYNE PHASE LOCK SYSTEM

[75] Inventor: Steven N. Holdaway, Santa Rosa, Calif.

[73] Assignee: Hewlett-Packard Company, Palo Alto, Calif.

[21] Appl. No.: 804,828

[22] Filed: Jun. 8, 1977

[51] Int. Cl.² .......................... H04B 1/26; H03D 1/16
[52] U.S. Cl. ........................ 455/260; 331/22; 455/259; 455/316; 455/150
[58] Field of Search ................ 325/11, 345, 430, 431, 325/432, 433, 436, 460, 419–421; 331/17, 25, 18, 19, 22, 31, 38

[56] References Cited

U.S. PATENT DOCUMENTS

| | | | |
|---|---|---|---|
| 3,008,043 | 11/1961 | Caulk | 325/433 |
| 3,864,636 | 2/1975 | Fukuda et al. | 325/421 |
| 4,061,980 | 12/1977 | Sato | 325/433 |

*Primary Examiner*—Robert L. Griffin
*Assistant Examiner*—Alexander Gerasimow
*Attorney, Agent, or Firm*—Robert S. Hulse

[57] ABSTRACT

A heterodyne phase lock system is disclosed having a plurality of oscillator circuits, a similar plurality of heterodyne (mixer-filter) circuits representing an input circuit, and a similar plurality of heterodyne circuits representing a control circuit, at least one of the oscillator circuits being a voltage controlled oscillator (VCO) circuit. The heterodyne circuits of the input circuit are cascaded, i.e., linked each to the other, successively, and the heterodyne circuits of the control circuit are likewise cascaded. Each oscillator is linked to a pair of heterodyne circuits, i.e., to one heterodyne circuit in the input circuit and to one heterodyne circuit in the control circuit, and applies a common output signal to said pair of heterodyne circuits. The control circuit includes a phase lock circuit, and is responsive to an applied reference signal for adjusting the output of the VCO and correcting for or substantially cancelling frequency drift, residual FM, and phase noise introduced into the system by the oscillators.

This manner of linking oscillators to both heterodyne input and control circuits in a system so as to be able to correct, by adjusting a single oscillator, for frequency drift, residual FM, and phase noise from all of the oscillators in the system, is applicable to receiver and generator type systems alike. The system also includes an offset oscillator for tuning the system.

16 Claims, 20 Drawing Figures

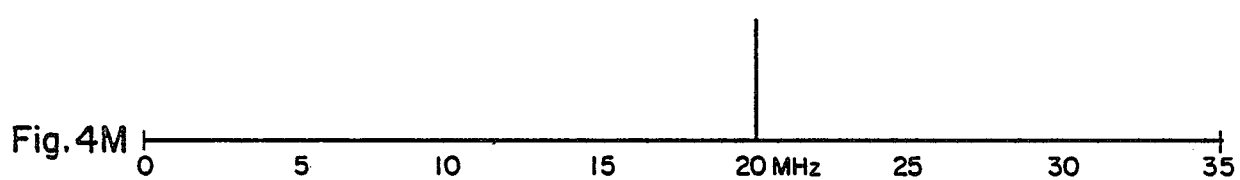
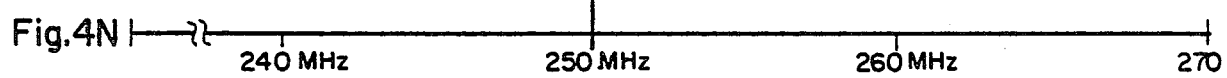

HETERODYNE PHASE LOCK SYSTEM

BACKGROUND OF THE INVENTION

Heterodyne receivers are widely used in communications and other equipment for converting applied input signals to fixed lower frequency signals. By means of such receivers, an input signal with frequency components that vary over a wide frequency range may be converted to a fixed frequency signal (usually referred to as an intermediate frequency signal) for subsequent detection and measurement. A swept heterodyne receiver of the prior art is shown in FIG. 1. Generally, the greater the number of oscillators used in the receiver to perform the conversion, the more selective the receiver becomes.

To correct for factors such as frequency drift, frequency jitter (residual FM noise) and phase noise which limit the frequency resolution of the receiver, a selected oscillator, typically the first oscillator of the receiver, is phase locked to a spectrally pure reference signal (i.e., a reference signal with a noise level lower than the signal level desired to be detected and measured) by means of a phase lock loop as shown in FIG. 2. Such a phase lock loop serves to correct for residual FM and phase noise introduced into the receiver system by the first oscillator (a voltage controlled oscillator), but does not correct for (i.e., does not substantially eliminate) residual FM and phase noise introduced into the system by the other oscillators of the system (e.g., the second through the $n^{th}$ oscillators).

Also, it is often difficult to determine the tuned frequency of the receiver (i.e., the exact frequency to which the receiver is tuned). This difficulty arises from the fact that in some very wide tuning receivers, such as spectrum analyzers, many of the oscillators are tuned to microwave frequencies (e.g., 2–4 GHz), which frequencies are difficult to count directly. (It is necessary to count the frequency of each and every one of the oscillators in order to find the tuned frequency of the receiver, because the tuned frequency of a receiver is dependent upon the frequencies to which the individual oscillators are tuned.)

What is needed, therefore, is a system that corrects for frequency drift, residual FM, and phase noise from all of the oscillators in the system, and that provides a means for determining the exact frequency to which the system is tuned without having to count the frequencies of the individual oscillators.

SUMMARY OF THE INVENTION

Thus, in accordance with the illustrated preferred embodiment of the present invention, a heterodyne receiver phase lock system is provided having an input circuit, a feedback or control circuit, and a signal producing means comprising a plurality of oscillator circuits at least one of which is a voltage controlled oscillator circuit. A similar plurality of heterodyne (mixer-filter) circuits is included in each of the input and control circuits, with respective heterodyne circuits in the input circuit corresponding to respective heterodyne circuits in the control circuit, thereby forming ordered pairs of heterodyne circuits, each pair being coupled to receive, as a common input signal, the output signal from a corresponding oscillator circuit. The control circuit also includes a harmonic signal generator, and a phase detector or phase lock circuit. A spectrally pure reference frequency signal is applied to the harmonic signal generator and applied as a first input to the phase lock circuit. The output signal from the harmonic signal generator is applied to the first heterodyne circuit in the control circuit, and the output signal from the last heterodyne circuit in the control circuit is applied, as a second input signal, to the phase lock circuit.

In response to an input signal applied to a selected one of the heterodyne circuits of the input circuit, the phase lock circuit of the control circuit applies a phase lock voltage to a selected voltage-controlled oscillator, thereby correcting for frequency drift, residual FM and phase noise introduced into the system by all of the oscillators, and causing the system to produce, for subsequent detection and measurement, an intermediate frequency signal that is an accurate representation of a selected component of the input signal. Also, the frequency to which the system may be tuned can be easily determined without having to count the frequencies of the individual oscillators. For tuning purposes, a tuning circuit comprising a voltage controlled offset oscillator and a voltage summing circuit is included in the system, the voltage summing circuit being responsive to applied tune and sweep signals for producing a DC voltage signal. The voltage controlled offset oscillator applies an offset frequency signal to the last ($3^{rd}$) heterodyne circuit of the control circuit, in response to the DC voltage signal and the output signal from the last ($3^{rd}$) oscillator.

The heterodyne circuits of the control circuit may also be included in a generator system to correct for noise introduced into the generator system by oscillators of the system.

DESCRIPTION OF THE PREFERRED EMBODIMENT

Figure 1:
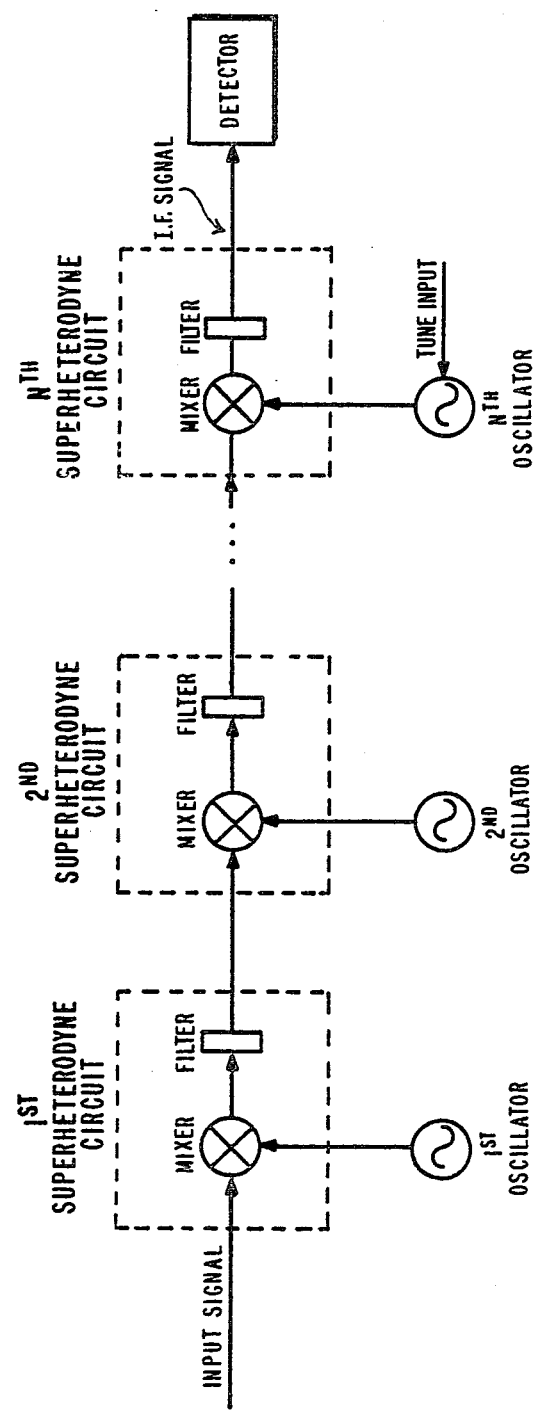
FIG. 1 is a block diagram of a system of the prior art.
Figure 2:
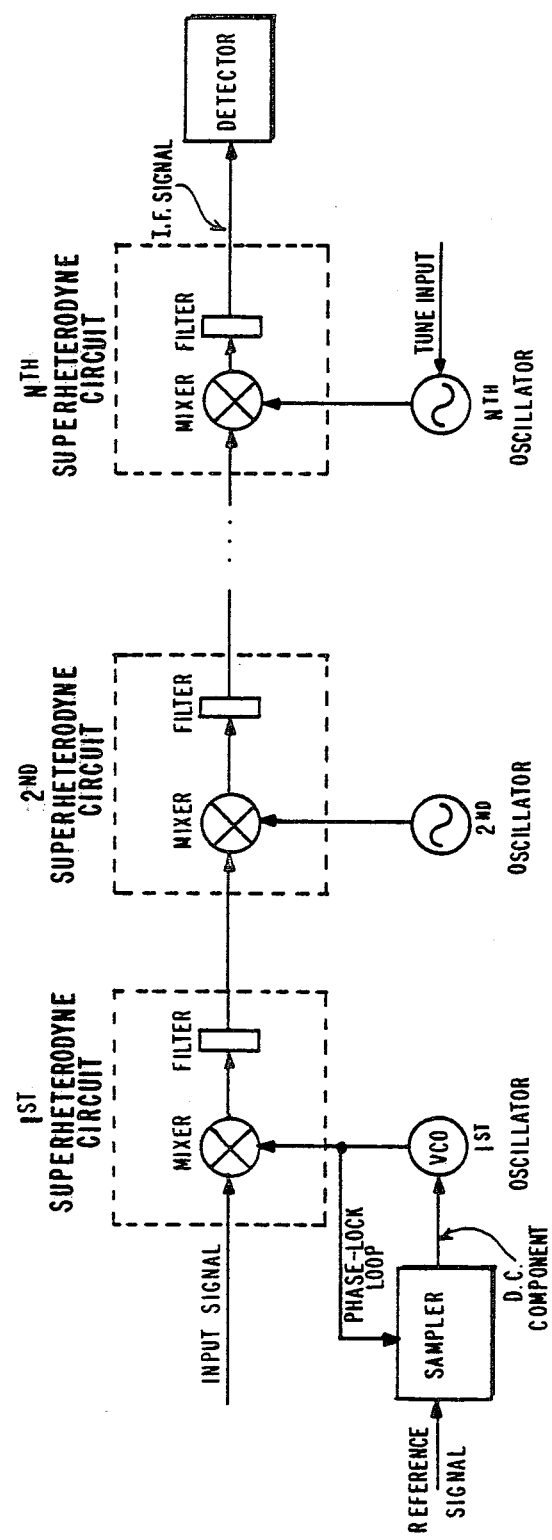
FIG. 2 is a block diagram of the prior art system of FIG. 1, including a phase lock loop.
Figure 3:
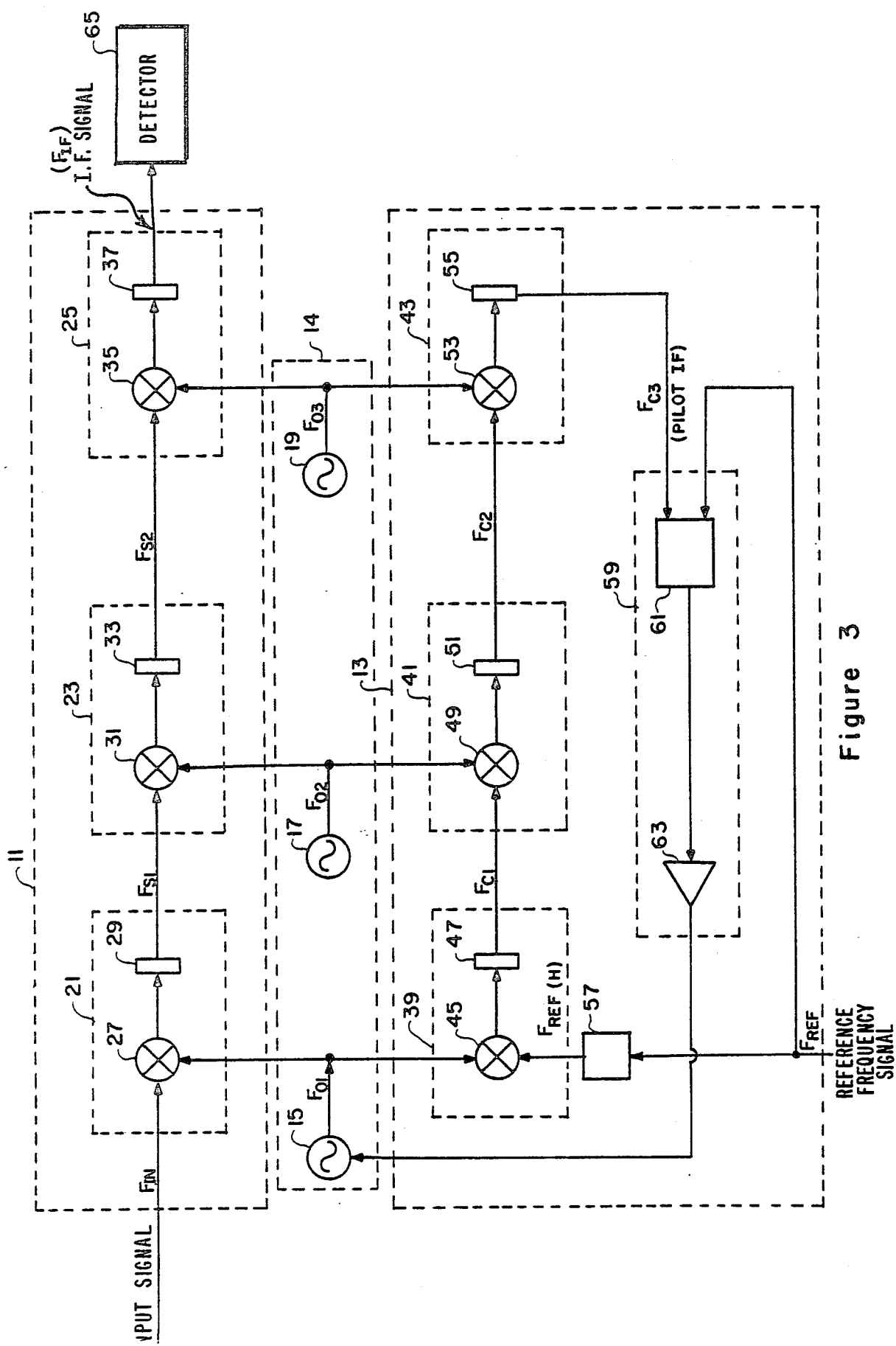
FIG. 3 is a block diagram of the system of the present invention, showing various circuit elements for receiving and detecting a signal.

Referring now to FIG. 3, a heterodyne receiver phase lock system is shown having an input circuit 11, a feedback or control circuit 13 and a signal producing means 14 comprising three oscillators 15, 17, 19, oscillator 15 being a voltage controlled oscillator, (i.e., an oscillator, the frequency of whose output signal is controllable by an applied voltage), and oscillator 17 being shiftable in frequency. Input circuit 11 comprises a first heterodyne circuit 21, a second heterodyne circuit 23, and a third heterodyne circuit 25 arranged in cascaded fashion, with each heterodyne circuit containing a mixer and a filter. Control circuit 13 also comprises first, second and third heterodyne circuits 39, 41, 43, arranged in cascaded fashion, with each heterodyne circuit containing a mixer and a filter. Control circuit 13 further comprises a harmonic signal generator 57 and a phase detector or phase lock circuit 59. Phase lock circuit 59 comprises a phase comparator 61 and a loop or integrating amplifier 63.

Figure 4A:
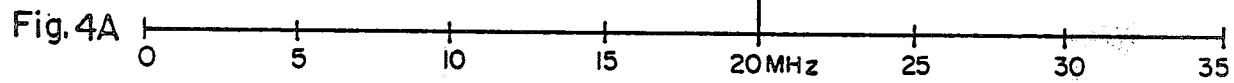
FIGS. 4A–4N are graphic illustrations of signals applied to and produced by certain of the circuit elements of the system of FIG. 3.
Figure 4B:
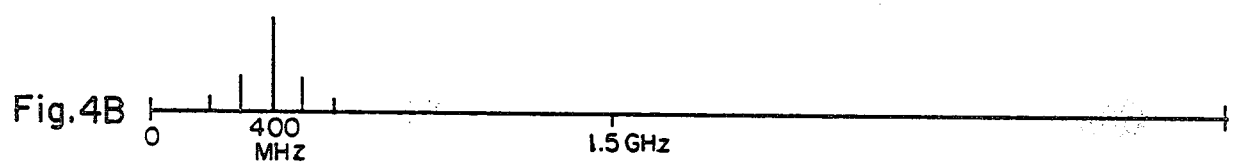
Figure 4C:
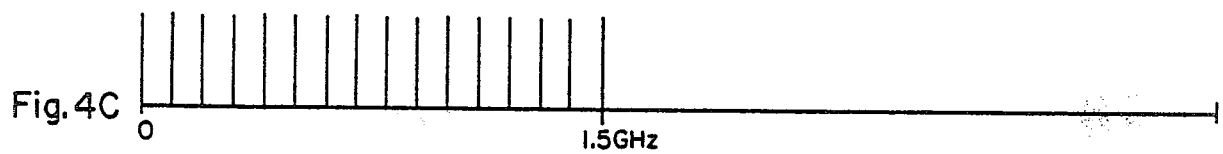
Figure 4D:
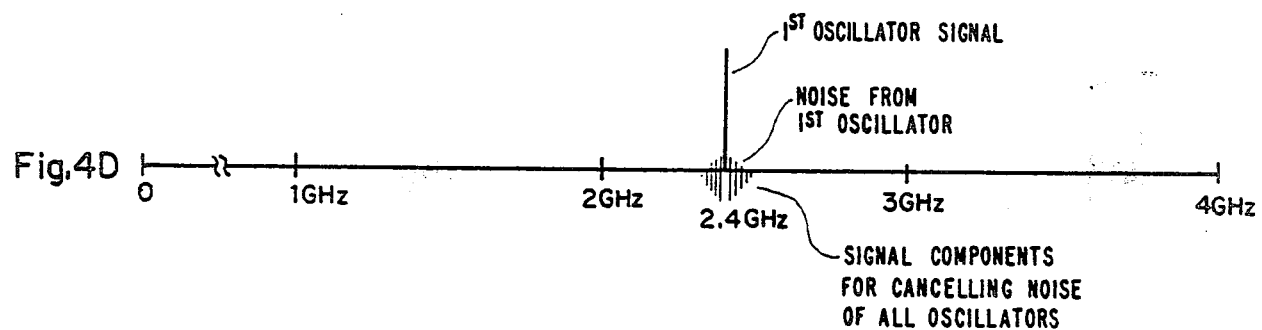
Figure 4E:
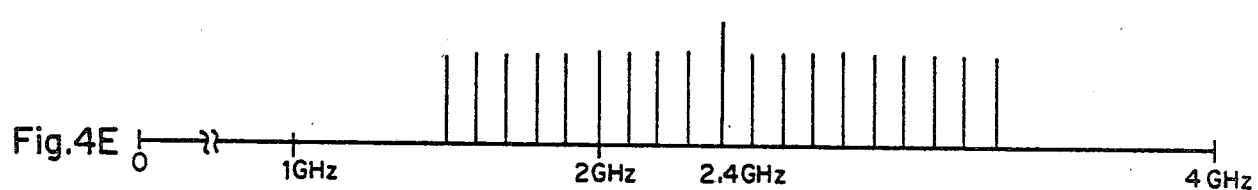
Figure 4F:
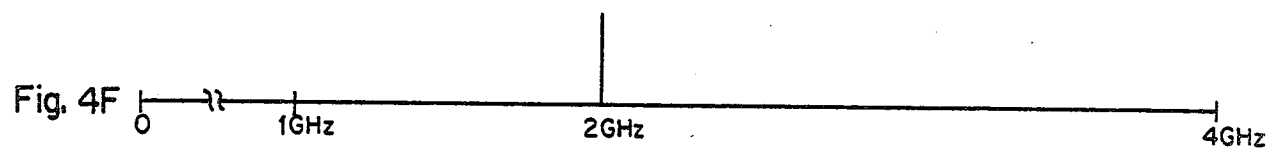
Figure 4G:
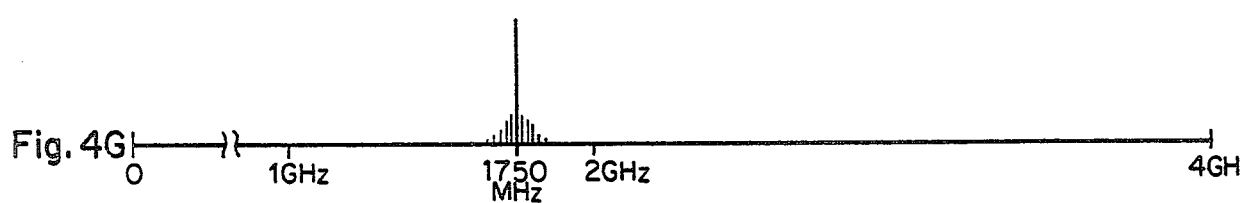
Figure 4H:
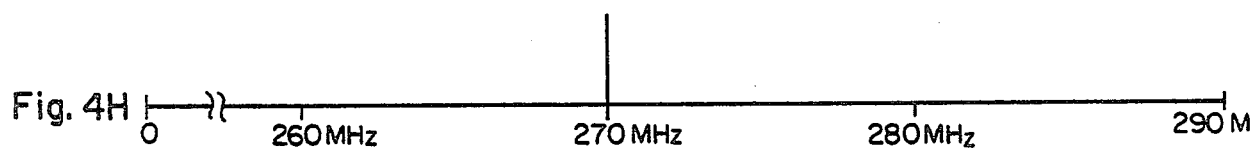
Figure 4I:
Figure 4J:
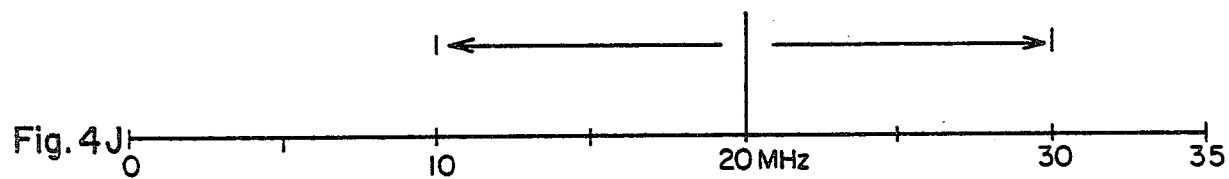

A spectrally pure reference signal (e.g., a signal from a crystal oscillator, such as the 20 MHz signal shown in FIG. 4A) is applied to harmonic signal generator 57 and to phase comparator 61 of phase lock circuit 59. An input signal (as shown in FIG. 4B) whose center frequency or fundamental component is to be measured or detected, is applied to mixer 27 of first heterodyne circuit 21 of input circuit 11. The system converts the input signal, which may vary over a wide frequency range, to a fixed or intermediate frequency (I.F.) signal, for subsequent detection and measurement. The conversion is performed by mixing the input signal with signals from oscillators 15, 17, and 19, and by filtering out unwanted mixing products. Oscillators 15, 17, 19 are tuned to different frequencies, each of which frequency bears a predetermined constant offset relationship to the fundamental frequency component of the input signal. Harmonic signal generator 57, in response to application of the spectrally pure reference frequency signal, applies a stable spectrally pure, precise frequency comb (harmonics of the reference signal which lie in the signal input bandwidth of the system as shown, for example, in FIG. 4C) to mixer 45 of circuit 39. An output signal (for example, a signal as shown in FIG. 4D) from first oscillator 15 is also applied to mixer 45. Mixer 45 mixes or heterodynes the signal (including frequency drift, residual FM, and phase noise) from oscillator 15 with the frequency comb, and produces therefrom a mixed signal as shown in FIG. 4E. This mixed signal is then filtered by filter 47 (e.g., a filter with center frequency of 2 GHz) to produce a first control signal as shown in FIG. 4F. The first control signal is applied to mixer 49 of heterodyne circuit 41, where it is combined (heterodyned) with the output signal from oscillator 17, (an output signal including residual FM and phase noise of oscillator 17 as shown, for example, in FIG. 4G), and the combination is filtered by filter 51 (e.g., a 260-280 MHz filter), to produce a second control signal as shown in FIG. 4H. This second control signal is then applied to mixer 53 of heterodyne circuit 43, where it is combined with the signal (as shown in FIG. 4I, including frequency drift, residual FM, and phase noise) from oscillator 19, and the combination is filtered by filter 55 to produce a third control signal as shown in FIG. 4J. This third control signal represents a "pilot I.F. signal" into which the harmonics of the reference frequency signal, which are close in frequency to the fundamental component of the input signal, are converted. (This third control signal has a frequency in the range of 10-30 MHz, corresponding to the width of filter 55, when not phase locked, and a frequency of 20 MHz, corresponding to the reference frequency, when phase locked.)

The third control signal, together with the reference signal, is then applied to phase comparator 61. Phase comparator 61, in response to the applied reference and third control signals, produces a DC voltage signal proportional to the frequency difference between the reference and third control signals. This DC voltage signal is then applied to loop (integrating) amplifier 63 which produces therefrom, a correction or phase lock voltage signal. This phase lock voltage signal is then fed back and applied to VCO 15, causing VCO 15 to adjust for differences between the reference frequency signal and the third control signal, thereby adjusting for frequency drift, residual FM, and phase noise contained in the third control signal from all of the oscillators 15, 17, 19 in the system. Once the phase lock or feedback loop is locked, i.e., once the third control signal and the reference frequency signal are found by comparator 61 to be of the same frequency, the DC voltage signal from the comparator, and hence the phase lock or correction voltage signal applied to VCO 15 from amplifier 63, is maintained unchanged, causing VCO 15 to cancel (i.e., to limit to the extent of the spectral purity of the reference frequency) all frequency drift, residual FM, and phase noise introduced into the system by the oscillators 15, 17, 19. VCO 15 cancels the frequency drift, residual FM, and phase noise by producing in its output signal (FIG. 4D), components which are equal in amplitude, but opposite in phase (i.e., 180° out of phase) to the frequency drift, residual FM, and phase noise.

Figure 4K:
Figure 4L:
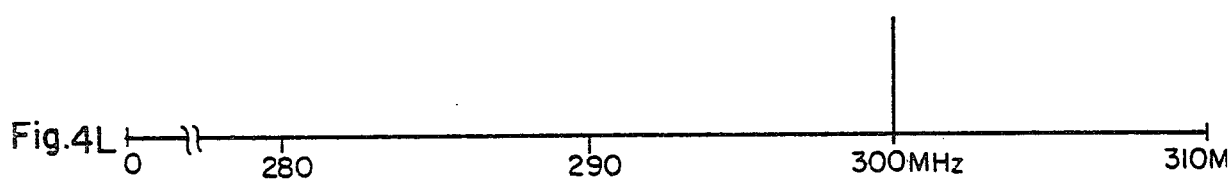

As shown in FIG. 3, the output signal from VCO 15 is applied to mixer 27 and to mixer 45. Mixer 27 combines this output signal with the applied input signal (FIG. 4B) and produces therefrom a heterodyned signal which is filtered by filter 29 to produce a first stage signal as shown in FIG. 4K. This first stage signal and the output signal (FIG. 4G) from second oscillator 17 are then heterodyned (combined) by mixer 31, and the combination filtered by filter 33 to produce a second stage signal as shown in FIG. 4L. The second stage signal and the output signal (FIG. 4I) from third oscillator 19 are then combined by mixer 35, and the combination filtered by filter 37 to produce an intermediate frequency (I.F.) or third stage signal as shown in FIG. 4M. This I.F. signal may then be detected and measured by a detector 65.

Figure 5:
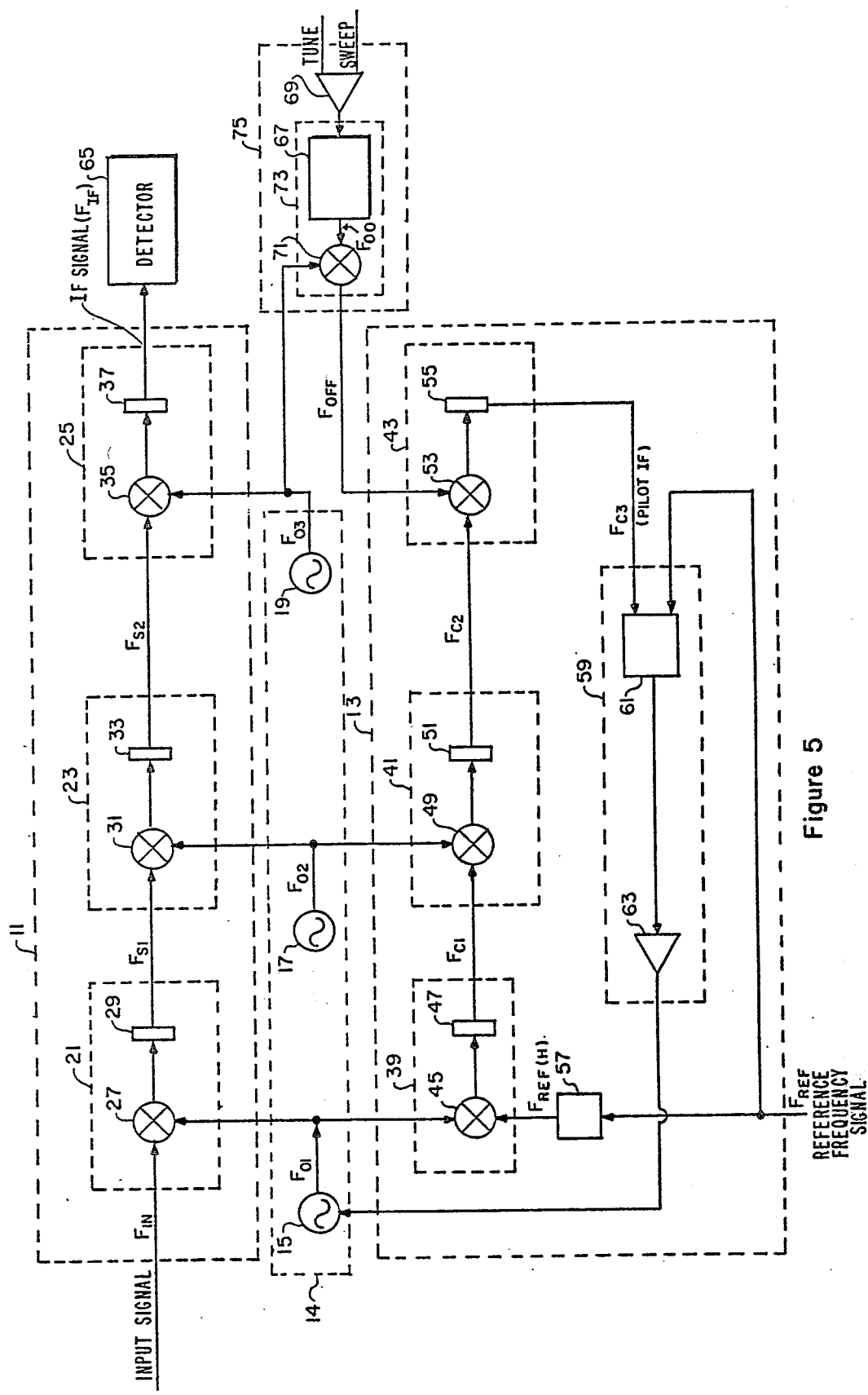
FIG. 5 is a block diagram of the system of FIG. 3 including a tuning circuit having an offset oscillator circuit component.
Figure 6:
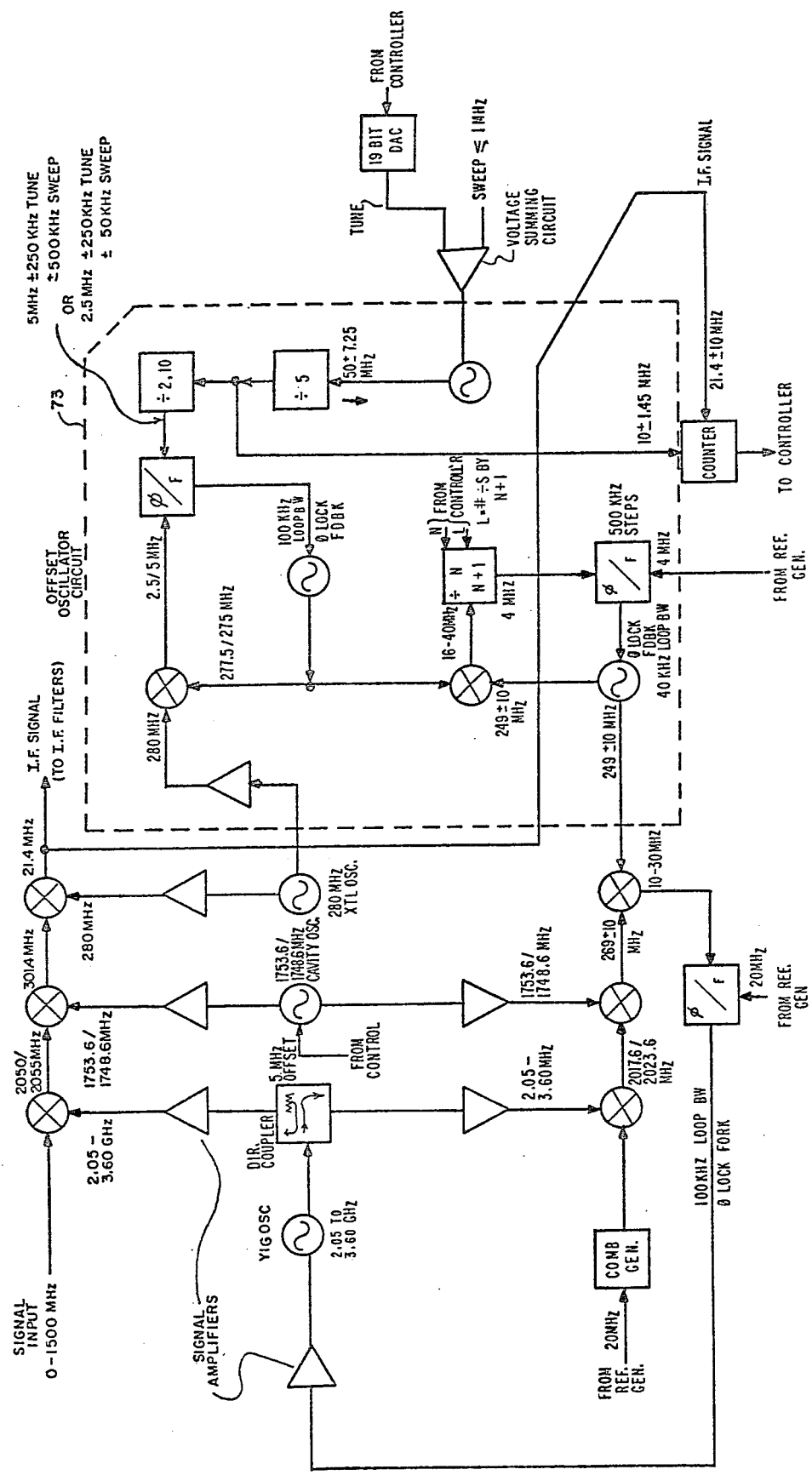
FIG. 6 is a block diagram of the system of FIG. 5 showing the offset oscillator circuit in greater detail.

To enable the system to be continuously tuned, even to frequencies between the comb lines (i.e., to frequencies between the harmonics of the reference signal), a spectrally pure voltage controlled offset oscillator 67 of a known frequency is included in the system, as shown in FIG. 5. FIG. 5 shows tuning circuit 75 to include voltage summing circuit 69 and offset oscillator circuit 73, where offset oscillator circuit 73 comprises offset oscillator 67 and mixer 71. Frequency tuning and sweep is performed by sweeping or tuning offset oscillator 67. Voltage summing circuit 69 is responsive to applied tune and sweep signals for producing a DC output voltage signal (the applied tune signal being a DC voltage that is proportional to the frequency to which the system is tuned, and the applied sweep signal being a DC voltage that is proportional to the width of a desired frequency window). In response to the DC voltage signal from voltage summing circuit 69, offset oscillator 67 produces an output signal (representing a variable offset frequency $F_{00}$) that is proportional to the DC output voltage signal. Mixer 71 combines or heterodynes this output signal with the output signal from third oscillator 19 and produces therefrom an offset signal, with frequency, $F_{OFF}$, as shown in FIG. 4N. (Frequency $F_{OFF}$ represents the frequency of the output signal from mixer 71, which frequency is proportional to the DC voltage applied to offset oscillator 67, given that the output signal from oscillator 19 has a frequency of 280 MHz.) This offset signal is then applied to mixer 53. This permits the frequency to which the receiver is tuned to be varied without having to vary the reference signal, thereby enabling the system to be continuously tuned to frequencies between the comb lines. The frequency offset $F_{OO}$ represents an amount or frequency range by which the output signal from first oscillator 15 may be offset. This offset or frequency range is equal to the spacing between the harmonics of the reference frequency plus the desired sweep range. (The output signal from first oscillator 15 is offset by an amount equal, but opposite in polarity, to the frequency range represented by $F_{OO}$.) Thus, first oscillator 15 is indirectly tuned or swept by offset oscillator 67. Because offset oscillator 67 can be tuned to a low frequency (e.g., 1–100 MHz), it is usually stable and introduces little noise into the system. To avoid difficulty in performing the phase lock operation when the system is tuned to a frequency located midway between two harmonics of $F_{REF}$, offset oscillator 67 may be tuned to a fixed offset frequency $F_{00}$ equal to $\frac{1}{2}F_{REF}$. This will cause one of the two harmonics to move into the center of the passband of filter 55 for frequency $F_{C3}$. To cancel undesirable harmonics of the comb that may be introduced into the control circuit 13 of the system, when offset oscillator 67 is tuned over its range ($\pm\frac{1}{2}F_{REF}$), the output signal from second oscillator 17 is shifted by an amount equal to $\frac{1}{4}F_{REF}$.

In some prior art wide-band swept receiver systems, the first oscillator is generally tuned over a wide range (2–4 GHz), and phase locked to a high ($2000^{th}$–$4000^{th}$) harmonic of the reference frequency. The reference frequency is generally kept low (usually about 1 MHz) and, to preserve signal amplitude accuracy, the tuning range of one of the other oscillators in the system (typically, the second oscillator) is generally kept small, i.e., not larger than the range or space between harmonics of the reference signal. However, because the first oscillator is phase locked to a high harmonic of the reference frequency, and because phase noise increases with harmonic number, the first oscillator introduces a substantial amount of phase noise into the system.

In the system of the present invention, the tuning of offset oscillator 67 does not change the frequencies $F_{S1}$, $F_{S2}$, $F_{IF}$ in the input signal conversion path, and does not change the reference frequency $F_{REF}$, and since the pilot or control signals path does not require precise amplitude flatness, it can have a much larger frequency tuning range than the small tuning range of, for example, the second oscillator in certain prior art systems. This makes it possible to have a higher reference frequency (e.g., a reference frequency greater than 1 MHz) and, hence, less phase noise in the system. For example, if a reference frequency of 20 MHz is used, about a 26 dB improvement in phase noise is possible over the system's performance using a 1 MHz reference frequency. Also, unlike certain prior art phase lock receiver systems, the desired mixing product of the output signal from the 1st oscillator and the comb is not a DC component, but a signal at microwave frequency (approximately 2 GHz). This indicates that lower harmonic numbers of $F_{REF}$ can be used, since the harmonic of the reference frequency which is being converted is in the same frequency range (<2 GHz) as the input signal, rather than being in the frequency range (>2 GHz) of the 1st oscillator as in prior art phase lock systems. When the system of the present invention is tuned to 20 MHz, for example, the fundamental of the reference frequency is the signal which the 1st oscillator 15 is locked to. In a prior art phase lock system, the 1st oscillator may be locked to the $2000^{th}$ harmonic of the reference frequency. The resulting difference in phase noise performance of these two systems could be as much as a 66 dB improvement in phase noise of the system of the present invention over that of the prior art.

Also, the system of the present invention, for example, as shown in FIG. 5, provides an easy and accurate means of determining the frequency to which the system is tuned. This represents a significant improvement in system performance when compared to the difficulty encountered in counting microwave frequencies of the oscillators in receiver systems (e.g., spectrum analyzers) of the prior art. For example, in the system of FIG. 5, the frequency to which the system is tuned (i.e., the fundamental component or center frequency of the input signal as shown in FIG. 4B) may be easily calculated for known values of the reference frequency ($F_{REF}$), the offset frequency ($F_{00}$) and the I.F. frequency ($F_{IF}$), as indicated by the following mathematical relationship:

$$F_{IN}=F_{REF(H)}-F_{00}+F_{C3}-F_{IF} \qquad (1)$$

where, $F_{IN}$ represents the frequency to which the system is tuned, $F_{REF(H)}$ represents the frequency of the harmonic of $F_{REF}$ that produces a response in the frequency $F_{C3}$, $F_{00}$ represents a variable offset frequency of the output signal produced by offset oscillator 67, $F_{C3}$ represents the frequency of the third control (pilot IF) signal, and $F_{IF}$ represents the frequency of the IF signal to be detected. (This IF signal frequency is the frequency of the input signal which gives the maximum system response and which is equivalent to the center frequency of the filter with the narrowest passband in input circuit 11 of the system.)

Equation (1) above is derived as follows:

$$F_{IN}=F_{01}-F_{02}-F_{03}-F_{IF} \qquad (2)$$

where $F_{01}$, $F_{02}$ and $F_{03}$ represent respective frequencies to which the first, second and third oscillators are tuned.

$$F_{REF(H)}=F_{01}-F_{02}-F_{OFF}-F_{C3} \qquad (3)$$

Substituting $F_{03}-F_{00}$ for $F_{OFF}$ in equation 3, equation 3 then becomes:

$$F_{REF(H)}=F_{01}-F_{02}-(F_{03}-F_{00})-F_{C3} \qquad (4)$$

$$F_{REF(H)}=F_{01}-F_{02}-F_{03}+F_{00}-F_{C3} \qquad (5)$$

Solving for $F_{01}-F_{02}-F_{03}$ in both equations (2) and (5), we get, from equation (2):

$$F_{01}-F_{02}-F_{03}=F_{IN}+F_{IF} \qquad (6)$$

and from equation (5):

$$F_{01}-F_{02}-F_{03}=F_{REF(H)}-F_{00}+F_{C3} \qquad (7)$$

From equations (6) and (7), it can then be seen that:

$$F_{IN}+F_{IF}=F_{REF(H)}-F_{00}+F_{C3} \qquad (8)$$

and, $$F_{IN}=F_{REF(H)}-F_{00}+F_{C3}-F_{IF} \qquad (9)$$

Thus, from the foregoing, it can be seen that the frequency $F_{IN}$ to which the system is tuned can be determined independent of (i.e., without having to count) the frequencies ($F_{01}$, $F_{02}$, $F_{03}$) of the individual oscillators 15, 17, and 19. This frequency $F_{IN}$ can be easily determined since frequencies $F_{00}$, $F_{C3}$ and $F_{IF}$, which are generally low (i.e., less than 50 MHz), can be easily counted by means of conventional counter circuitry, and $F_{REF(H)}$ is a selected harmonic of known reference frequency $F_{REF}$.

In the event tuning circuit 75 is omitted from the system, as shown in FIG. 3, the term $F_{00}$ would be omitted from equation (5) above, and equations (2) and (5) could be combined to produce the relationship:

$$F_{IN} = F_{REF(H)} + F_{C3} - F_{IF} \quad (10)$$

In which event, $F_{IN}$ could be determined solely from the frequencies $F_{REF(H)}$, $F_{C3}$ and $F_{IF}$.

It should be noted that, whereas FIGS. 3 and 5 show a receiver system comprising three heterodyne (mixer-filter) circuits 21, 23, 25 in the input circuit 11, three heterodyne circuits 39, 41, 43 in the control or feedback circuit 13, and three oscillators 15, 17 and 19, the system could just as well have comprised N heterodyne circuits in the input circuit, N heterodyne circuits in the control circuit, and N oscillators, where N is an integer, representing a plurality of two or greater. Generally, the greater the number of oscillators utilized in the system, the more selective the receiver becomes and the easier it is to filter-off unwanted mixing products.

Figure 7:
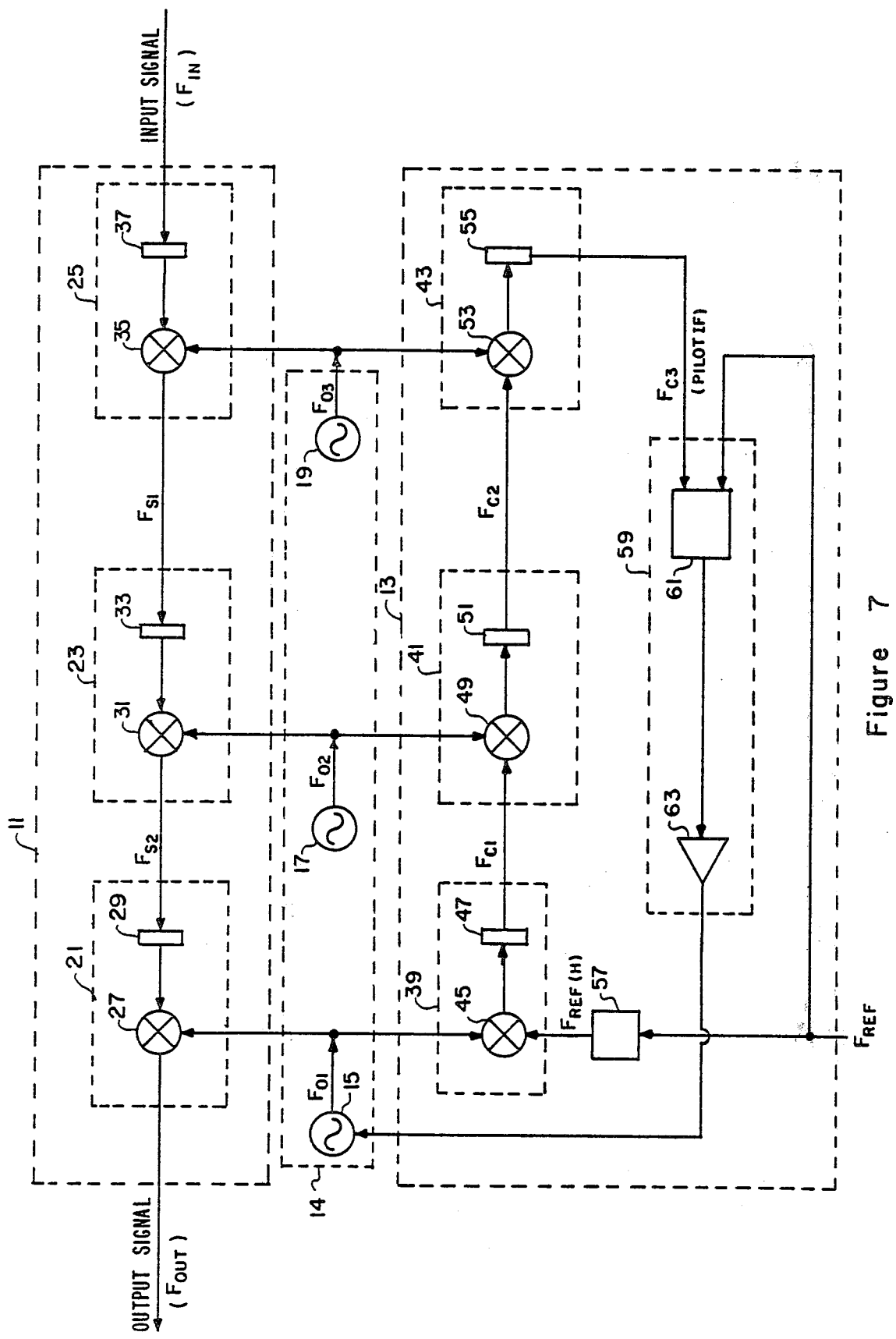
FIG. 7 is a block diagram of the system of the present invention showing various circuit elements for generating a signal.

It should also be noted that whereas FIGS. 3 and 5 show a receiver type system, the combination of heterodyne circuits in the input and control circuits may be utilized in a generator type system, in a similar manner as described hereinbefore, to correct for noise introduced by the oscillators into the system. For example, as shown in FIG. 7, in a generator system, an input signal may be introduced into the system at heterodyne circuit 25, and an output signal with multiple frequency components may be generated by the system from heterodyne circuit 21, the heterodyne circuits in the control loop serving to correct for noise introduced by the oscillators of the system.

I claim:

1. A system in a frequency tuned apparatus for cancelling noise in oscillating signals, enabling the frequency to which the apparatus is tuned to be determined independently of the frequencies of the oscillating signals, the system comprising:
   input circuit means having a first plurality of cascaded heterodyne circuits for producing successive stage signals, the first circuit of the plurality being coupled to receive an applied input signal;
   control circuit means having a phase detector means, and having a second plurality of cascaded heterodyne circuits for producing control signals, the first heterodyne circuit of this second plurality being coupled to receive harmonics of an applied reference signal, and the last heterodyne circuit of this second plurality being coupled for producing a last control signal;
   signal producing means having a third plurality of signal producing circuits, at least one of which is frequency-controllable for producing a first oscillating signal, the third plurality being equal to said first and second pluralities, with each signal producing circuit corresponding, in a one to one relationship, to each heterodyne circuit in the input circuit means and in the control circuit means, each signal producing circuit being coupled to a corresponding heterodyne circuit in the input circuit means and to a corresponding heterodyne circuit in the control circuit means for applying an oscillating signal to the corresponding heterodyne circuits, thereby to permit determination of the frequency to which the apparatus is tuned independent of the frequencies of the oscillating signals; and
   the phase detector means being coupled to receive the last control signal and the reference signal for applying a phase lock signal to the frequency-controllable signal-producing circuit, causing the frequency-controllable signal-producing circuit to add frequency components to the first oscillating signal substantially cancelling the noise in the oscillating signals.

2. The system of claim 1 wherein the frequency-controllable signal-producing circuit is a voltage controlled oscillator circuit.

3. The system of claim 1 wherein the phase detector means includes a comparator and an amplifier, the comparator being disposed for producing a DC voltage signal in response to the applied reference signal and last control signal, and the amplifier being disposed for receiving the DC voltage signal and producing therefrom the phase lock signal.

4. The system of claim 1 wherein the control circuit means includes a harmonic signal generator coupled to the first heterodyne circuit of the control circuit means and coupled to receive the reference signal for producing harmonics of the reference signal.

5. The system of claim 1 wherein said system includes a tuning circuit for tuning the system over a selected frequency range without changing the frequencies of the successive stage signals, and without changing the frequency of the reference signal, the tuning circuit and the last of the cascaded heterodyne circuits of the input circuit means being disposed to receive the oscillating signal from the last signal-producing circuit of the plurality of signal-producing circuits, the tuning circuit also being disposed for applying a first frequency offset signal to the last of the cascaded heterodyne circuits of the control circuit means.

6. The system of claim 5 wherein the tuning circuit includes a voltage summing circuit responsive to applied tune and sweep signals for producing a DC voltage signal.

7. The system of claim 6 wherein the tuning circuit further includes an offset oscillator circuit comprising a voltage controlled offset oscillator and a mixer, the voltage controlled offset oscillator being responsive to the DC voltage signal from the voltage summing circuit for producing a second variable offset frequency signal enabling the system to be tuned to a selected frequency and swept over the selected frequency range, and the mixer being responsive to the second variable offset frequency signal for producing the first frequency offset signal.

8. A system in a frequency tuned apparatus for cancelling noise in oscillating signals, enabling the frequency to which the apparatus is tuned to be determined independently of the frequencies of the oscillating signals, the system comprising:
   first frequency-controllable signal producing means for producing a first oscillating signal;

second signal producing means for producing a second oscillating signal;

first heterodyning means coupled to receive the first oscillating signal and an applied input signal for producing a first stage signal representing a selected heterodyned product of the input and first oscillating signals;

second heterodyning means coupled to receive the first stage signal and the second oscillating signal for producing an output signal representing a selected heterodyned product of the first stage and second oscillating signals;

third heterodyning means coupled to receive the first oscillating signal and harmonics of an applied reference signal for produciing a first control signal representing a selected heterodyned product of the harmonics and first oscillating signal;

fourth heterodyning means coupled to receive the first control signal and the second oscillating signal for producing a second control signal representing a selected heterodyned product of the first control and second oscillating signals, thereby to permit determination of the frequency to which the apparatus is tuned independent of the frequencies of the oscillating signals; and phase detector means coupled to receive the second control signal and the reference signal for applying a phase lock signal to the frequency-controllable signal producing means, causing the frequency-controllable signal producing means to introduce frequency components into the first oscillating signal substantially cancelling the noise in the oscillating signals.

9. The system of claim 8 wherein the frequency-controllable signal producing means is a voltage controlled oscillator circuit.

10. The system of claim 8 wherein the phase detector means includes a comparator and an amplifier, the comparator being disposed for producing a DC voltage signal in response to the applied reference signal and second control signal, and the amplifier being disposed for receiving the DC voltage signal and producing therefrom the phase lock signal.

11. The system of claim 8 wherein said system includes a harmonic signal generator coupled to the third heterodyning means and coupled to receive the reference signal for producing harmonics of the reference signal.

12. The system of claim 8 wherein said system includes an oscillator as the second signal producing means, said oscillator being coupled to the second and fourth heterodyning means for producing the second oscillating signal.

13. The system of claim 8 wherein said system includes a tuning circuit for tuning the system over a selected frequency range without changing the frequencies of the first stage and the output signals, and without changing the frequency of the reference signal, the tuning circuit and the second heterodyning means being disposed to receive the second oscillating signal, the tuning circuit also being disposed for applying a first frequency offset signal to the fourth heterodyning means.

14. The system of claim 13 wherein the tuning circuit includes a voltage summing circuit responsive to applied tune and sweep signals for producing a DC voltage signal.

15. The system of claim 14 wherein the tuning circuit further includes an offset oscillator circuit comprising a voltage controlled offset oscillator and a mixer, the voltage controlled offset oscillator being responsive to the DC voltage signal from the voltage summing circuit for producing a second variable offset frequency signal enabling the system to be tuned to a selected frequency and swept over the selected frequency range, and the mixer being responsive to the second variable offset frequency signal for producing the first frequency offset signal.

16. A method for cancelling noise in oscillating signals in a frequency tuned apparatus having at least two oscillating signal sources at least one of which is frequency-controllable, and for determining, independently of frequencies of the oscillating signals, the frequency to which the apparatus is tuned, the method comprising the steps of:

heterodyning a first oscillating signal with an applied input signal for producing a desired first stage signal;

heterodyning a second oscillating signal with the first stage signal for producing a desired second stage signal;

heterodyning the first oscillating signal with harmonics of an applied reference signal for producing a first control signal, the first control signal having noise components contributed by the first oscillating signal;

heterodyning the second oscillating signal with the first control signal for producing a second control signal, the second control signal having noise components contributed by the oscillating signals;

producing a phase lock signal proportional to a difference between the second control signal and the reference signal; and applying the phase lock signal to the frequency-controllable oscillating signal source causing said source to add frequency components to the first oscillating signal substantially cancelling the noise in the oscillating signals.

* * * * *